(12) United States Patent
Higuchi

(10) Patent No.: US 8,072,538 B2
(45) Date of Patent: Dec. 6, 2011

(54) SOLID-STATE IMAGE PICKUP DEVICE INCLUDING LENS UNIT HELD BY HOLDING SECTION INCLUDED IN SAME LENS UNIT, AND ELECTRONIC APPARATUS INCLUDING SAME SOLID-STATE IMAGE PICKUP DEVICE

(75) Inventor: Masatomo Higuchi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 423 days.

(21) Appl. No.: 12/378,343

(22) Filed: Feb. 12, 2009

(65) Prior Publication Data
US 2009/0219433 A1    Sep. 3, 2009

(30) Foreign Application Priority Data
Feb. 28, 2008  (JP) .................. 2008-048641

(51) Int. Cl.
H04N 5/225    (2006.01)
(52) U.S. Cl. ........................ 348/374; 348/335
(58) Field of Classification Search .............. 348/335, 348/373–376; 396/76, 533
See application file for complete search history.

(56) References Cited

U.S. PATENT DOCUMENTS
7,430,368 B2 * 9/2008 Lee ............................ 396/76
2006/0290801 A1 12/2006 Jao

FOREIGN PATENT DOCUMENTS
JP    2007-006502 A    1/2007
JP    2007-052186 A    3/2007
JP    2007-163707      6/2007

* cited by examiner

Primary Examiner — Timothy J Henn
(74) Attorney, Agent, or Firm — George W. Neuner; Edwards Wildman Palmer LLP

(57) ABSTRACT

A camera module 100 of the present invention is arranged such that a lens barrel 32 is provided with an internal screw thread 32a on its internal side, and that a holding section 41, which is a portion of a lens holder 4, the portion holding a lens unit 3, is provided with an external screw thread 41a on its external side, the external screw thread 41a being engaged with the internal screw thread 32a. As a result, it is possible to provide the camera module 100 capable of preventing contamination by dirt into a light path and thereby reducing imaging defects.

19 Claims, 3 Drawing Sheets ed States Patent

SOLID-STATE IMAGE PICKUP DEVICE INCLUDING LENS UNIT HELD BY HOLDING SECTION INCLUDED IN SAME LENS UNIT, AND ELECTRONIC APPARATUS INCLUDING SAME SOLID-STATE IMAGE PICKUP DEVICE

This Nonprovisional application claims priority under U.S.C. §119(a) on Patent Application No. 048641/2008 filed in Japan on Feb. 28, 2002, the entire contents of which are hereby incorporated by reference.

FIELD OF THE INVENTION

The present invention relates to a solid-state image pickup device capable of preventing adherence of dirt in a light path so as to reduce imaging defects, and to an electronic apparatus including the solid-state image pickup device.

BACKGROUND OF THE INVENTION

A portable terminal (electronic apparatus) such as a camera-equipped portable phone includes a camera module (solid-state image pickup device). Many camera-equipped portable phones have a closeup mode (macro photography mode) used to photograph a flower and the like in a closeup manner, in addition to a normal photography mode used to photograph a person, scenery and the like.

Patent Document 1, for example, discloses a camera module having a macro photography function. FIG. 7 is a cross-sectional view illustrating the camera module of Patent Document 1. As illustrated in FIG. 7, the camera module 600 includes: a circuit board 601; a CMOS sensor 602 mounted on the circuit board 601; and a lens holder 604 containing the CMOS sensor 602.

The camera module 600 further includes a lens barrel 632 holding a lens 631, the lens barrel 632 being held inside the lens holder 604. Further, the lens holder 604 has a screw section 604a formed on its internal wall, and the lens barrel 632 has a screw section 632a formed on its outer periphery so that the screw section 632a is engaged with the screw section 604a. With the arrangement, when a macro lever 606 is operated for a mode selection, the lens barrel 632 is moved in sync with the macro lever 606. As a result, the lens 631 is moved so as to have a focal length in accordance with the mode thus selected.

However, the arrangement of Patent Document 1 poses a problem that imaging defects are caused by contamination by dirt in a light path.

Specifically, according to Patent Document 1, when a mode is selected, a friction between the lens holder 604 (the screw section 604a) and the lens barrel 632 (the screw section 632a) causes dirt and/or scrap. Since the lens barrel 632 is held inside the lens holder 604, the dirt thus caused adheres to an optical filter 605 present in the light path. Consequently, the dirt on the optical filter 605 casts a shadow on the CMOS sensor 602. This causes a black dot or stain to be reflected in an outputted image, thereby leading to a decrease in yield and reliability of the camera module 600.

As described above, according to Patent Document 1, the lens barrel 632 is held inside the lens holder 604, and therefore a contamination path for a foreign object such as dirt is formed in the light path. This causes direct contamination by the dirt caused as above into the light path, thereby causing an imaging defect.

[Patent Document 1]
Japanese Unexamined Patent Application Publication No. 163707/2007 (Tokukai 2007-163707; published on Jun. 28, 2007)

SUMMARY OF THE INVENTION

The present invention has been accomplished in view of the above problem. It is an object of the present invention to provide a solid-state image pickup device capable of preventing contamination by dirt into a light path so as to reduce imaging defects, and to provide an electronic apparatus including the solid-state image pickup device.

In order to attain the above object, a solid-state image pickup device of the present invention includes: a lens unit for forming an object image; a solid-state image pickup element for converting the object image, formed by the lens unit, into an electric signal; and a lens holder containing the solid-state image pickup element and holding the lens unit, the lens unit having a first internal screw section on its internal side, the lens holder having a holding section holding the lens unit, the holding section having a first external screw section on its external side, the first external screw section being engaged with the first internal screw section.

According to the above invention, the lens unit is held on the external side part of the holding section (outside the lens holder). This keeps an area where the lens unit and the lens holder are in contact with each other, away from the solid-state image pickup element. This in turn prevents contamination by dirt into a light path, the dirt being caused by friction between the lens unit and the lens holder (the first internal screw section of the lens unit and the first external screw section of the holding section). As a result, it is possible to reduce imaging defects caused by such dirt.

The solid-state image pickup device of the present invention may preferably be arranged such that the lens unit includes: a lens; a lens barrel holding the lens; and a macro ring holding the lens barrel, the first internal screw section being formed on an internal side of the macro ring.

According to the above invention, the lens unit includes a lens, a lens barrel, and a macro ring. In other words, the solid-state image pickup device has a macro photography function. In this solid-state image pickup device having the macro photography function, the first internal screw section is formed on the internal side of the macro ring. This allows the macro ring to be held on the external side part of the holding section (outside the lens holder). This in turn keeps an area where the macro ring and the lens holder are in contact with each other, away from the solid-state image pickup element. This prevents contamination by dirt into the light path, the dirt being caused by friction between the macro ring and the lens holder (i.e., between the first internal screw section of the macro ring and the first external screw section of the holding section). As a result, it is possible to reduce imaging defects caused by such dirt in the solid-state image pickup device having the macro photography function.

In order to attain the above object, an electronic apparatus of the present invention includes the solid-state image pickup device. This allows provision of an electronic apparatus capable of preventing contamination by dirt into the light path so as to reduce imaging defects.

Additional objects, features, and strengths of the present invention will be made clear by the description below. Further, the advantages of the present invention will be evident from the following explanation in reference to the drawings.

DESCRIPTION OF THE EMBODIMENTS

Embodiments of the present invention will be described below with reference to FIGS. 1 through 6.

A solid-state image pickup device of the present invention is arranged such that an area where a lens unit and a lens holder are in contact with each other is provided so as to keep away from a solid-state image pickup element. This prevents a contamination by dirt into a light path so as to reduce imaging defects.

Such a solid-state image pickup device is suitably applicable to an electronic apparatus, such as a camera-equipped portable phone, a digital still camera, and a security camera, which can photograph. In the following embodiments, a camera module for use in a camera-quipped portable phone will be described.

First Embodiment

Figure 1:
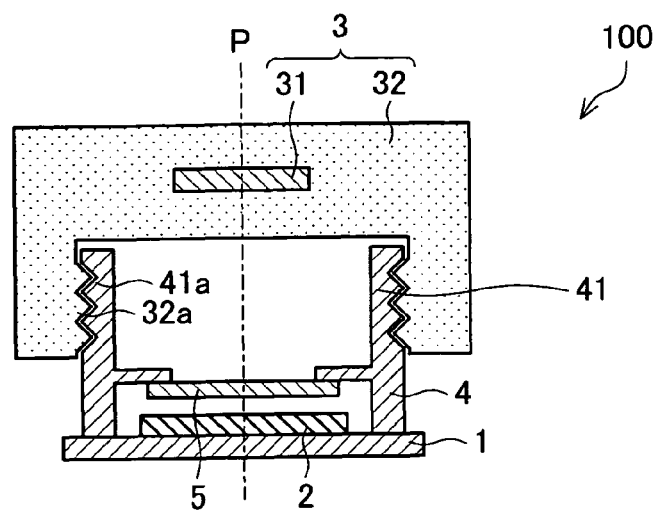
FIG. 1 is a cross-sectional view illustrating a camera module of the present invention.

FIG. 1 is a cross-sectional view illustrating a camera module 100 according to a first embodiment. As illustrated in FIG. 1, the camera module 100 includes a circuit board 1, and a solid-state image pickup element 2 mounted on the circuit board 1. The camera module 100 further includes a lens unit 3, and a lens holder 4 which contains the solid-state image pickup element 2 and which holds the lens unit 3. The camera module 100 also includes a light-transmitting member 5 which is held by the lens holder 4 and which is provided so as to face the solid-state image pickup element 2. Note that, for convenience of explanation, "on a circuit board 1 side (i.e., closer to the circuit board 1)" is referred to as "downward", whereas "on a light-transmitting member 5 side (i.e., on a lens unit 3 side, or farther from the circuit board 1)" is referred to as "upward."

The circuit board 1, which receives an electric signal from the solid-state image pickup element 2, is a board having patterned wiring (not shown). The circuit board 1 is electrically connected to the solid-state image pickup element 2 via the wiring. This allows the circuit board 1 and the solid-state image pickup element 2 to both send an electric signal to and receive an electric signal from each other. The circuit board 1 is made up of a printed circuit board, a glass epoxy board, a ceramic board or the like, for example. The circuit board 1 is arranged so as to be capable of electrically connecting to an external device.

The solid-state image pickup element 2 is a semiconductor substrate (e.g., a silicon single crystal substrate) provided at a central portion of the circuit board 1. The solid-state image pickup element 2 has a rectangular shape of two dimensions, and has a semiconductor circuit formed thereon. The solid-state image pickup element 2 is, for example, a charge-coupled device (CCD) image sensor, a complementary metal-oxide semiconductor (CMOS) image sensor, or a threshold voltage modulation image sensor (VMIS). The solid-state image pickup element 2 converts an object image, formed by the lens unit 3, into an electric signal. In other words, the solid-state image pickup element 2 is a sensor device which carries out a photoelectric conversion with respect to incident light from the lens unit 3.

The solid-state image pickup element 2 includes, on its front surface (upper surface), a light-receiving section (not shown) in which a plurality of pixels are arranged in a matrix manner. The light-receiving section corresponds to an effective pixel region (image pickup surface) of the solid-state image pickup element 2. The solid-state image pickup element 2 converts, into an electric signal, an object image (light transmitted through the light-transmitting member 5) which is formed on the light-receiving section, and then outputs the electric signal thus converted as an analog image signal.

The circuit board 1 has mounted thereon various electronic components (not shown) for driving the camera module 100. Such electronic components, for example, include: an amplifier circuit section (analog signal circuit section) which amplifies an electric signal that has been subjected to a photoelectric conversion of a light-receiving element in the solid-state image pickup element 2, and which outputs the electric signal thus amplified as an analog signal; an analog-to-digital conversion processing circuit section which converts the analog signal into a digital signal; a CPU which carries out various arithmetic processing in accordance with programs; a ROM which stores such programs; and a RAM which stores, for example, data in each process. These components control the entire camera module 100.

The lens unit 3 is a photographing optical system (optical structure) which forms an object image. In other words, the lens unit 3 is an optical system for causing light from an object to be subjected to an image formation onto the solid-state image pickup element 2. The lens unit 3 includes: a lens 31; and a lens barrel 32 which holds the lens 31 in its central portion. Both of the lens 31 and the lens barrel 32 can be made of resin, for example. The lens 31 has an optical axis which coincides with a central axis of the lens barrel 32. The lens unit 3 may be made of resin, for example. The lens unit 3 will be described later in detail.

The lens holder 4 is fixed on the circuit board 1 with an adhesive (not shown). The lens holder 4 contains the solid-state image pickup element 2 and holds the lens unit 3. The lens holder 4 of the present embodiment contains (seals) the solid-state image pickup element 2 in its lower portion, and holds the lens unit 3 on its external side part (on the outer periphery part). The lens holder 4 of the present embodiment is a cylindrical member made of resin. Further, as described below, the lens holder 4 holds the lens unit 3 outside its external side. The lens holder 4 will be described later in detail.

The light-transmitting member 5 is provided between the lens unit 3 and the solid-state image pickup element 2, and is held so as to face the solid-state image pickup element 2 within the lens holder 4. The light-transmitting member 5 is arranged so as to cover at least the light-receiving section of the solid-state image pickup element 2. The light-transmitting member 5 is made of a light-transmitting material such as a light-transmitting glass or resin. The light-transmitting member 5 can include an optical filter such as an infrared cut filter which prevents incidence of infrared rays on the solid-state image pickup element 2. This allows the light-transmitting member 5 to have the function of blocking external infrared rays.

In the camera module 100 arranged as above, external light obtained via the lens unit 3 is guided through the light-transmitting member 5 into the solid-state image pickup element 2.

Subsequently, the light is received as an image by the light-receiving element provided in the light-receiving section of the solid-state image pickup element 2.

The following description deals with a feature of the camera module 100. In the camera module 100, dirt present in a light path P (a path extending through the lens 31, the light-transmitting member 5, and the solid-state image pickup element 2) causes a black dot in a pickup image due to a shadow of the dirt, thereby causing an imaging defect.

In view of this, the camera module 100 is arranged such that the lens unit 3 is held outside the lens holder 4. This prevents a contamination by dirt into the light path P, the dirt being caused by friction between the lens unit 3 and the lens holder 4.

Specifically, while the camera module 100 is assembled, the lens 31 in the lens unit 3 needs to be adjusted so as to be brought into focus. Each of the lens unit 3 and the lens holder 4 is threaded in its area where they are in contact with each other. More specifically, an internal side surface of the lens barrel 32 and an external side surface of the lens holder 4 are engaged with each other. This allows the lens unit 3 to move up and down along the external side surface of the lens holder 4 so that the lens unit 3 is brought into focus.

Note however that the moving up and down of the lens unit 3 causes the lens barrel 32 and the lens holder 4 to be in friction. This causes minute dirt (a foreign object, a fragment of the lens barrel 32 and/or the lens holder 4). It is likely that such dirt adheres in the light path P (e.g., adheres on the light-transmitting member 5). The dirt on the light-transmitting member 5 casts a shadow on the solid-state image pickup element 2. This causes a black dot or stain to be reflected in an outputted image, thereby leading to a decrease in yield and reliability of the camera module 100. As a result, the dirt present in the light path P causes an imaging defect.

As described above, the moving of the lens unit 3 causes dirt in the area where the lens barrel 32 and the lens holder 4 are in contact with each other. The dirt in turn causes an imaging defect. In view of this, the lens unit 3 of the camera module 100 is arranged so as to take countermeasures against a contamination by such dirt which causes an imaging defect.

More specifically, as illustrated in FIG. 1, the lens holder 4 includes a holding section 41 which holds the lens unit 3 (the lens barrel 32). The lens barrel 32 is provided so as to surround the holding section 41. This causes the internal side surface of the lens unit 3 (the lens barrel 32) and the external side surface of the lens holder 4 (the holding section 41) to be in contact with each other. Further, the lens barrel 32 and the holding section 41 are threaded (screw thread) on their respective surfaces which are in contact with each other. In other words, the lens barrel 32 is provided with an internal screw 32a on its internal side surface so that the internal screw 32a surrounds a part of the holding section 41. The part of the holding section 41 is provided, on its external side surface, with an external screw 41a which is engaged with the internal screw 32a.

This allows the lens unit 3 to move, in response to a rotation of the lens barrel 32, along the external side surface of the lens holder 4, i.e., along the light path P (in an optical axis direction). On this account, it is possible for the lens unit 3 to be brought into focus, by adjusting a distance between the solid-state image pickup element 2 and the lens unit 3 during manufacture of the camera module 100. Note that the camera module 100 is a fixed-focus camera module having a fixed focal length. As such, once the lens unit 3 is brought into focus, the lens unit 3 is fixed as it is.

As described above, according to the camera module 100, the lens barrel 32 is held outside the lens holder 4 (i.e., on the external side part of the holding section 41). This causes the solid-state image pickup element 2 to keep away from the area where the lens unit 3 and the lens holder 4 are in contact with each other. This prevents a contamination by dirt into the light path P, the dirt being caused by friction between the lens unit 3 and the lens holder 4 (i.e., between the internal screw 32a of the lens barrel 32 and the external screw 41a of the holding section 41). As a result, it is possible to reduce imaging defects caused by such dirt.

The camera module 100 can be assembled as follows: First, the internal screw 32a of the lens barrel 32 is screwed into the external screw 41a of the lens holder 4 (the holding section 41). Then, the lens holder 4 is bonded and cured onto the circuit board 1 while the lens barrel 32 is screwed into the lens holder 4. Finally, a position of the lens barrel 32 is adjusted so that the lens unit 3 is brought into focus. The camera module 100 can thus be assembled.

Second Embodiment

Figure 2:
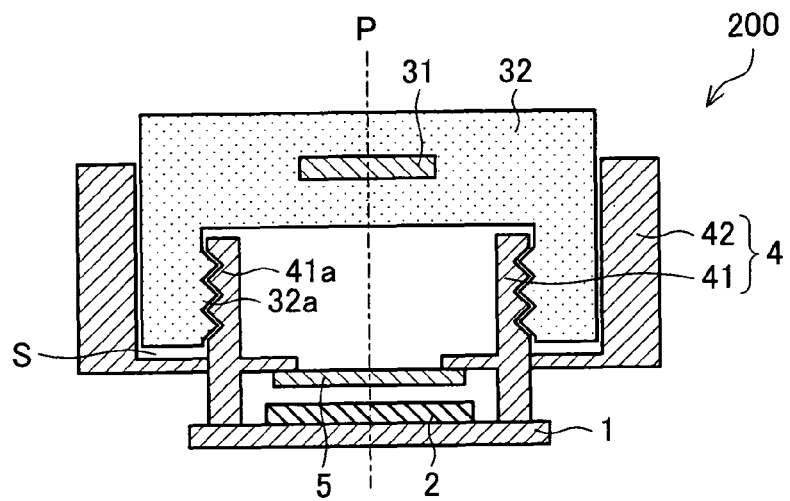
FIG. 2 is a cross-sectional view illustrating another camera module of the present invention.

FIG. 2 is a cross-sectional view illustrating a camera module 200 according to a second embodiment. It should be noted that members in the second embodiment which are same as or similar to those used in the first embodiment are assigned the same reference numerals, and that the description of the members is omitted.

As illustrated in FIG. 2, the camera module 200 of the present embodiment has an arrangement substantially similar to that of the camera module 100 of the first embodiment. The difference between the two camera modules 100 and 200 lies in the shape of a lens holder 4.

Specifically, in addition to the arrangement of the lens holder 4 of the camera module 100, the lens holder 4 of the camera module 200 includes a surrounding section 42 which surrounds a bottom part and an outer periphery part of the lens barrel 32. The surrounding section 42 is provided so as to extend from the external side surface of the holding section 41 (i.e., from the surface on which the external screw 41a is formed) along the bottom part and the outer periphery part of the lens barrel 32. The lens holder 4 of the camera module 200 therefore has a dual structure. The bottom part and the outer periphery part of the lens barrel 32 are contained in a space S which is defined by the holding section 41 and the surrounding section 42.

In a case where no surrounding section 42 is provided as in the camera module 100 of the first embodiment, dirt caused by a friction between the lens barrel 32 and the holding section 41 falls onto the circuit board 1. Such dirt on the circuit board 1 is likely to float in the air in response to vibration or impact which is applied to the camera module 100 during manufacture, transportation, and/or use. Under the circumstances, adherence of the floating dirt to the lens 31 leads to an imaging defect.

In contrast, in a case where the lens holder 4 includes a surrounding section 42 as in the camera module 200 of the present embodiment, the holding section 41 and the surrounding section 42 form a space S for containing the lens unit 3 (the lens barrel 32). As such, even in a case where dirt is caused by a friction between the lens barrel 32 and the holding section 41, the dirt is caught in the space S. In other words, the space S serves as a tray for such dirt. Thus, even in a case where vibration or impact is applied to the camera module 200 during manufacture, transportation, and/or use, the dirt does not leak out of the space S to float in the air within the camera module 200. This makes it possible to surely reduce imaging defects caused by the dirt. Furthermore, the surrounding section 42, which is formed along the bottom part and the outer periphery part of the lens barrel 32, also serves as a member stably supporting the lens barrel 32. In addition, the surrounding section 42 further serves as a member protecting the lens barrel 32 since the lens barrel 32 is not exposed.

The surrounding section 42 can be provided, on its internal surface (in the space S), with an adhesive (not shown). In other words, the adhesive may be applied to a portion where dirt is caught in the space S. This causes the dirt caught in the space S to adhere to the adhesive, thereby ensuring that it is in the space S that the dirt is caught. This consequently prevents occurrence of imaging defects caused by the dirt for an extended period of time, and surely prevents a contamination by dirt into the light path P.

The adhesive is not particularly limited to a specific one. For example, fat or resin in a semisolid state (or in a near solid state) can be used. Grease, for example, is preferable. Grease is a kind of fat in a semisolid state or a near liquid state, and can be made, for example, from a lubricant in a semisolid state (or in a near solid state) or in a paste form. The grease can be made, for example, from a material such as a molybdenum disulfide lubricant, a white lubricant, a silicone lubricant, or a perfluoropolyether lubricant. The grease can be: a mineral grease containing mineral oil in primary ingredient; a poly-α-olefin grease containing poly-α-olefin oil in primary ingredient; a silicone grease containing silicone oil; a fluorosilicone grease; a perfluoropolyether grease containing perfluoropolyether in primary ingredient; or the like grease. The above grease can be used alone or by mixture of two or more. The grease can further include an additive for grease such as lithium soap, calcium soap, or polytetrafluoroethylene (PTFE).

Even in a case where the adhesive is excessively applied in the space S, the adhesive does not leak and fall into the light path P because the holding section 41 serves as a wall (dam).

The amount of the adhesive to be applied is not limited to a specific amount, provided that the amount is sufficient to cause dirt to adhere to the adhesive. Furthermore, the amount of the adhesive can be set in accordance with the properties of the adhesive. An amount of the adhesive can be applied to an area where dirt is likely to be caused, which amount is more than that actually needed.

The use of the grease as the adhesive brings about the following advantages:
(a) The grease can not only cause dirt to adhere thereto, but also coat the dirt (i.e., cover up the dirt) adhered to an area where the grease is to be applied, before application of the grease.
(b) The grease can readily be spread over an application position because of its fluidity.
(c) The grease has less deterioration in properties (e.g., physical properties such as heat resistance and weather resistance).
(d) The grease is nontoxic.
(e) It is possible to readily change properties of the grease (e.g., viscosity of the grease can readily be adjusted) by changing composition of the grease.
(f) The grease requires no maintenance.

Third Embodiment

Figure 3:
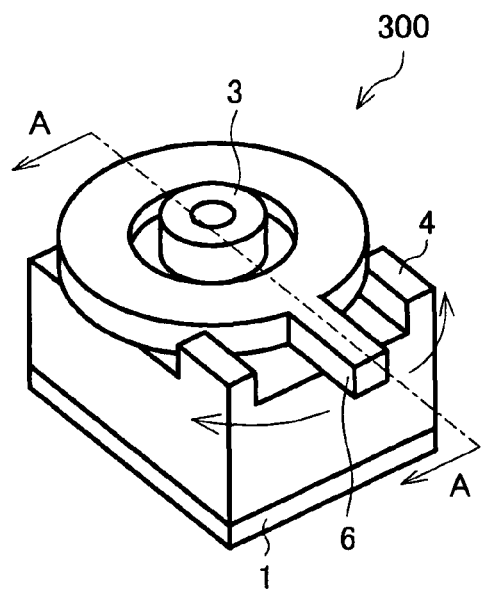
FIG. 3 is a perspective view illustrating still another camera module of the present invention.
Figure 4:
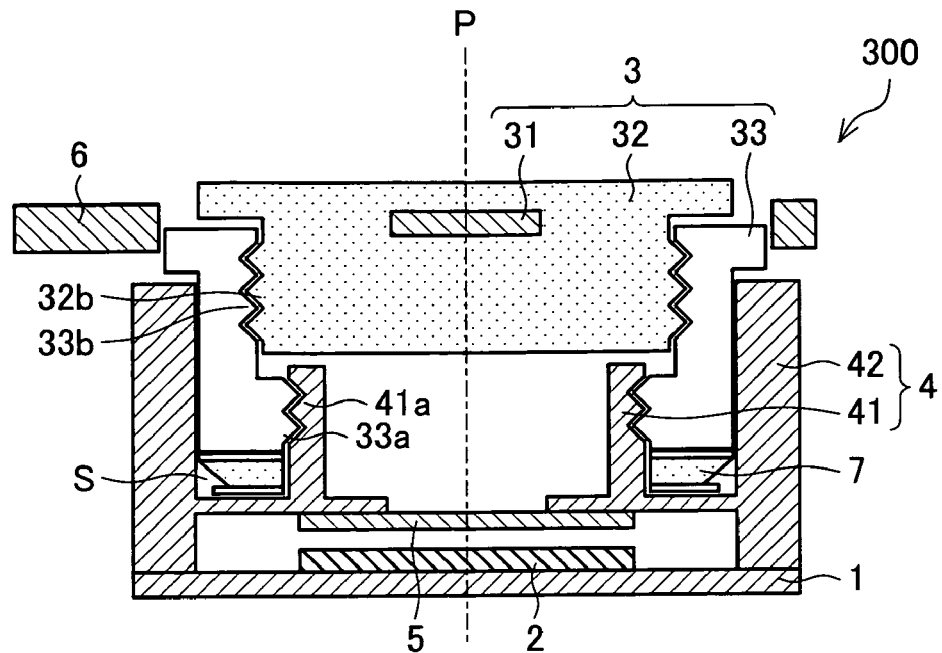
FIG. 4 is a cross-sectional view illustrating the camera module of FIG. 3, taken along line A-A.

FIG. 3 is a perspective view illustrating an outline of a camera module according to the present embodiment. FIG. 4 is a cross-sectional view, taken on A-A line of FIG. 3, illustrating the camera module 300 of FIG. 3. It should be noted that members in the third embodiment which are same as or similar to those illustrated in FIGS. 1 and 2 used in the first and second embodiments, respectively, are assigned the same reference numerals, and that the description of the members is omitted.

As illustrated in FIG. 4, the camera module 300 of the present embodiment has an arrangement substantially similar to that of the camera module 200 of the second embodiment. The camera module 300 is different from the camera module 200 in that: the camera module 300 has a macro photography function; the lens holder 4 includes a surrounding section 42 in addition to the holding section 41; and the camera module 300 includes a tension ring 7.

Specifically, as illustrated in FIG. 3, the camera module 300 includes a macro lever 6 above the lens holder 4. Operating the macro lever 6 enables switching between a normal photography mode and a closeup mode (macro photography mode). The operation of the macro lever 6 causes a mode selection to be carried out in accordance with the moving up and down of a lens unit 3. In a case of a camera-equipped portable phone, the macro lever 6 is provided so as to be exposed to the outside on an exterior of the portable phone. This allows a photographer to operate the macro lever 6. For example, the lens unit 3 is adjusted so as to have a focal length in the normal photography mode while the macro lever 6 is moved to a left edge, whereas the lens unit 3 is adjusted so as to have a focal length in the closeup mode while the macro lever 6 is moved to a right edge.

More specifically, as illustrated in FIG. 4, the lens unit 3 of the camera module 300 includes: a lens 31; a lens barrel 32 which holds the lens 31 in its central portion; and a macro ring 33 which holds the lens barrel 32. The lens 31, the lens barrel 32, and the macro ring 33 are provided in this order from the light path P side.

According to the camera module 300 having the macro photography function, an external side part of the holding section 41 and an internal side part of the macro ring 33 are in contact with each other, and, in the internal and external side parts, the holding section 41 and the macro ring 33 have their respective screw thread mechanisms which are engaged with each other. This allows the lens barrel 32 and the macro ring 33 to be movable, thereby allowing smooth movements of the lens barrel 32 and the macro ring 33. Further, when a mode selection is carried out in response to an operation of the macro lever 6, the lens barrel 32 and the macro ring 33 are moved in sync with the macro lever 6. This causes the lens 31 to move up and down so that the lens 31 has a focal length in accordance with the mode thus selected. Each focal length in each mode is predetermined so that the lens 32 is brought into focus in each mode. The focal length refers to a distance between an image pickup surface (light-receiving section) of the solid-state image pickup element 2 and the center of the lens 31.

More specifically, the lens barrel 32 is held inside the macro ring 33. An external side surface of the lens barrel 32 and the internal side surface of the macro ring 33 are in contact with each other. Further, the lens barrel 32 and the macro ring 33 are subjected to screw cuttings (screw threads) on their external and internal side parts, respectively, which are in contact with each other. To be specific, the lens barrel 32 is provided with an external screw (second external screw section) 32*b* on its surface (external side surface) which is in contact with the macro ring 33. The macro ring 33 is provided with an internal screw (second internal screw section) 33*b* on its surface (internal side surface) which is in contact with the lens barrel 32, the internal screw 33*b* being engaged with the external screw 32*b*. With the arrangement, a rotation of the lens barrel 32 allows the lens barrel 32 to move along the internal side surface of the macro ring 33, i.e. along the light path P (in the optical axis direction). This allows an adjustment of a distance between the solid-state image pickup element 2 and the lens unit 3 (the lens 31) so that the lens unit 3 is brought into focus during, for example, manufacturing of the camera module 300.

The macro ring 33 is provided between the holding section 41 and the surrounding section 42 of the lens holder 4. The surrounding section 42 is provided so as to surround a bottom part and an outer periphery part of the macro ring 33. In other words, the bottom part and the outer periphery part of the macro ring 33 are contained in a space S which is formed by the holding section 41 and the surrounding section 42. The internal side surface of the macro ring 33 and the external side surface of the lens holder 4 (the holding section 41) are in contact with each other. Further, the macro ring 33 and the holding section 41 are subjected to screw cuttings (screw thread) on their external and internal side parts, respectively, which are in contact with each other. To be specific, a portion of the macro ring 33, the portion surrounding the holding section 41, is provided with an internal screw (first internal screw section) 33a on its internal side surface. The holding section 41 is provided with an external screw (first external screw section) 41a on its external side surface, the external screw 41a being engaged with the internal screw 33a. This allows the macro ring 33 to be rotated in sync with the operation of the macro lever 6. Further, a rotation of the macro ring 33 allows the macro ring 33 to move along the external side surface of the lens holder 4, i.e., thereby moving the macro ring 33, which holds the lens barrel 32, up and down along the light path P. This allows an adjustment of a distance between the solid-state image pickup element 2 and the lens unit 3 so that the distance therebetween (focal length) corresponds to the normal photography mode or to the closeup mode, depending on the mode in use.

During the manufacture of the camera module 300, after the lens unit 3 is brought into focus (i.e., after the focus of the lens unit 3 is adjusted), the internal screw 33b and the external screw 32b are fixed to each other with an adhesive. In contrast, the internal screw 33a and the external screw 41a remain unfixed to each other. This causes the internal screw 33a and the external screw 41a to be movable in response to an operation of the macro lever 6. Thus, the lens barrel 32 and the macro ring 33 are simultaneously moved.

When the macro lever 6 is operated so that a mode select is carried out, a friction is caused between a portion of the macro ring 33 and a portion of the holding section 41. Thus, the use of the camera module 300 causes dust from such portions between which the friction is caused, thereby causing dirt. Such dirt, if present in the light path P, causes a black dot or stain to be reflected in a pickup image due to a shadow of the dirt. In other words, the dirt present in the light path P causes an imaging defect.

However, also in the camera module 300 having the macro photography function, the macro ring 33 is held outside the lens holder 4 (i.e., on the outer periphery part of the holding section 41). This causes an area, where the lens unit 3 and the lens holder 4 are in contact with each other, to be kept from the solid-state image pickup element 2. As such, it is possible to prevent contamination by dirt into the light path P, the dirt being caused by the friction between the lens unit 3 and the lens holder 4 (i.e., friction between the internal screw 33a of the macro ring 33 and the external screw 41a of the holding section 41). As a result, it is possible to reduce imaging defects caused by such dirt.

Further, in the camera module 300, the lens holder 4 includes: the holding section 41 holding the macro ring 33; and the surrounding section 42 surrounding a bottom part and an outer periphery part of the macro ring 33. The surrounding section 42 is provided so as to extend from the external side surface of the holding section 41 (i.e., from the surface on which the external screw 41a is formed) along the bottom part and the outer periphery part of the macro ring 33. In other words, the lens holder 4 of the camera module 300 has a dual structure as in the camera module 200 of the second embodiment. The bottom part and the outer periphery part of the macro ring 33 are contained in the space S which is defined by the holding section 41 and the surrounding section 42.

As described above, in a case where the lens holder 4 includes a surrounding section 42, the holding section 41 and the surrounding section 42 form a space S for containing the lens unit 3 (the macro ring 33). As such, even in a case where dirt is caused by a friction between the macro ring 33 and the holding section 41, the dirt is caught in the space S. In other words, the space S serves as a tray for such dirt. Thus, even in a case where vibration or impact is applied to the camera module 300 during manufacture, transportation, and/or use, the dirt does not leak out of the space S to float in the air within the camera module 300. This makes it possible to surely reduce imaging defects caused by the dirt. Furthermore, the surrounding section 42, which is formed along the bottom part and the external side surface of the macro ring 33, also serves as a member stably supporting the macro ring 33. In addition, the surrounding section 42 further serves as a member protecting the macro ring 33 since the macro ring 33 is not exposed.

In addition, according to the camera module 300, the internal screw 33a of the macro ring 33 is formed closer to the light path P than the internal screw 33b of the macro ring 33 is. This causes an area where the lens holder 4 (the holding section 41) and the macro ring 33 engage with each other to be provided so as to be closer to the light path P than an area where the lens barrel 32 and the macro ring 33 engage with each other. As such, the area, where the lens barrel 32 and the macro ring 33 are in contact with each other, is kept from the solid-state image pickup element 2 by the holding section 41. In other words, the holding section 41 serves as a barrier for keeping the area, where the lens barrel 32 and the macro ring 33 are in contact with each other, away from the solid-state image pickup element 2. When the lens barrel 32 is rotated so that the lens unit 3 is brought into focus, dirt is caused by a friction between the lens barrel 32 and the macro ring 33. Such dirt, however, is caught in the space S defined by the holding section 41 and the surrounding section 42. Further, the holding section 41 serves as a barrier. This prevents a contamination by dirt into the light path P, the dirt being caused by the friction between the lens barrel 32 and the macro ring 33. As a result, it is possible to reduce imaging defects caused by such dirt. As described above, the internal screws 33a and 33b are preferably positioned such that the internal screw 33a is provided on an inner side (i.e., closer to the light path P) compared to the internal screw 33b.

Further, the camera module 300 includes a tension ring 7 for cushioning impact which is caused between the lens unit 3 and the lens holder 4 while the macro lever 6 is operated. The tension ring 7 absorbs play (backlash) between the internal screw 33a and the external screw 41a. This causes pushing up of the lens unit 3 during image pickup so as to hold the lens unit 3 (the lens 31) at a predetermined position. In other words, the tension ring 7 also serves as stabilizing of the position of the lens unit 3. The tension ring 7 is provided in the space formed by the holding section 41 and the surrounding section 42 of the lens holder 4. More specifically, the tension ring 7 is provided on a surface of the lens holder 4 (the surrounding section 42), the surface facing the bottom part of the macro ring 33. The tension ring 7, which is disposed in the space S, does not block the light path P.

As described above, according to the camera module 300, the lens unit 3 is moved up and down in sync with a rotation of the macro lever 6. This causes pressure to be applied to a front surface of the tension ring 7 (i.e., the surface being in contact with the bottom part of the macro ring 33). While a downward pressure is applied from the bottom part of the macro ring 33 to the tension ring 7, the tension ring 7 expands sideways due to the pressure. This may cause the tension ring 7 to scrape the surface of the lens holder 4 (the surrounding section 42), the surface being in contact with the tension ring 7, thereby causing dirt. Further, the tension ring 7 may be scraped on its upper surface (a surface in contact with the macro ring 33) and/or lower surface (a surface in contact with the lens holder 4), thereby also causing dirt.

Note that the tension ring 7 is provided in the space S. In other words, the tension ring 7 is provided outside the light path P (outside the holding section 41 of the lens holder 4). This keeps, away from the solid-state image pickup element 2, (i) the area where the tension ring 7 and the lens unit 3 (the macro ring 33) are in contact with each other and (ii) the area where the tension ring 7 and the lens holder 4 (the holding section 41, the surrounding section 42) are in contact with each other. This prevents contamination by dirt into the light path P, the dirt being caused by a friction between the tension ring 7 and the lens holder 4. As a result, it is possible to reduce imaging defects caused by such dirt.

The tension ring 7, which is aimed at cushioning impact, is preferably made of an elastic material. Alternatively, the tension ring 7 can be made of metal. However, since a tension ring 7 made of metal may scrape the lens holder 4 (the surrounding section 42), it is preferable that the tension ring 7 be made of nonmetal. The tension ring 7 is preferably made of a nonmetallic material such as elastic rubber, resin, or elastomer. This allows efficiently cushioning impact with use of elasticity of the tension ring 7. A specific example of the tension ring 7 is a washer. The tension ring 7, in a case where it is made of nonmetal, cannot scrape the lens holder 4 (the surrounding section 42), and therefore causes no dirt. This consequently prevents dirt from being caused by the tension ring 7.

The tension ring 7 can be arranged so as not to have an opening, provided that a light path between the lens unit 3 and the solid-state image pickup element 2 is secured. A light path is secured also in a case where, for example, the tension ring 7 is made of a light-transmitting material.

The tension ring 7 can be provided with an adhesive such as grease. When the tension ring 7 is provided with an adhesive, it is possible to cause dirt, if caused, to adhere to the adhesive. More specifically, the tension ring 7 is, when made of nonmetal, capable of preventing dirt from being caused, and also is, when provided with grease, capable of trapping dirt, if caused, with use of the grease. This consequently prevents (or reduces) imaging defects caused by such dirt for an extended period of time.

Figure 5:
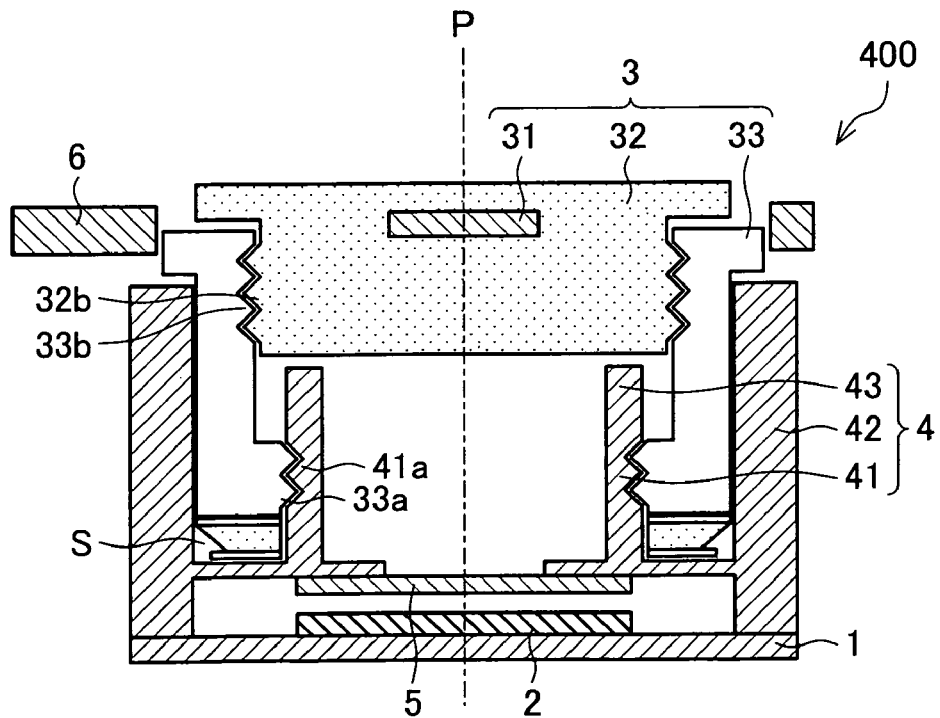
FIG. 5 is a perspective view illustrating still another camera module of the present invention.

The camera module 300 may be arranged as illustrated in FIG. 5. FIG. 5 is a cross-sectional view illustrating another camera module 400 of the present invention. The camera module 400 has substantially the same arrangement as that of the camera module 300. However, a difference between the camera modules 300 and 400 resides in an arrangement of a lens holder 4. Specifically, the lens holder 4 of the camera module 400 includes an unthreaded section 43 in addition to a holding section 41 and a surrounding section 42. The unthreaded section 43 is provided in the lens holder 4 so as to extend upward from the holding section 41 (the external screw 41a) and so as to have no screw cutting (no screw thread). The phrase "upward from the external screw 41a" indicates a direction away from the solid-state image pickup element 2. In other words, the unthreaded section 43 extends from the external screw 41a in a direction opposite to a direction in which the solid-state image pickup element 2 is provided. This allows the unthreaded section 43 to surely prevent contamination by dirt into the light path P, the dirt being caused by a friction between a lens barrel 32 and a macro ring 33 and also by a friction between a macro ring 33 and the lens holder 4 (the holding section 41). In other words, the unthreaded section 43 serves as a wall (dam) for preventing the contamination by the dirt into the light path P. As a result, it is possible to more surely reduce imaging defects caused by such dirt.

Figure 6:
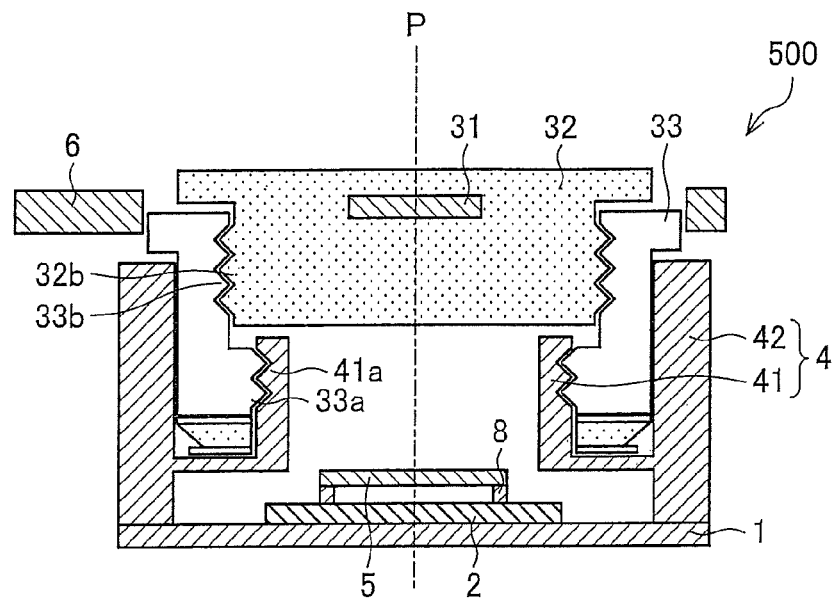
FIG. 6 is a perspective view illustrating still another camera module of the present invention.

Alternatively, the camera module 300 can be arranged as illustrated in FIG. 6. A camera module 500 has substantially the same arrangement as that of the camera module 300. The camera module 500 is, however, different from the camera module 300 in that the camera module 500 includes a light-transmitting member 5 which is provided above a solid-state image pickup element 2 so that a spacing is provided between the light-transmitting member 5 and a light-receiving section of the solid-state image pickup element 2 and so as to cover the light-receiving section. The light-receiving section refers to an effective pixel region in which a plurality of light-receiving elements are arranged on a surface of the solid-state image pickup element 2.

More specifically, the light-transmitting member 5 of the camera module 500 is provided above the surface, on which the light-receiving section is formed, of the solid-state image pickup element 2 so as to face the light-receiving section. In other words, the light-transmitting member 5 is provided so as to cover the light-receiving section. The light-transmitting member 5 is bonded to the solid-state image pickup element 2 with an adhesive section 8 formed around the light-receiving section. Further, the light-transmitting member 5 is provided so that a spacing (gap; airspace) is formed between the light-transmitting member 5 and the light-receiving section. As such, the solid-state image pickup element 2 and the light-transmitting member 5 cannot be in contact with each other. Since the adhesive section 8 is provided all around the light-receiving section, the spacing is a hermetically sealed space. This prevents, for example, contamination by moisture into the light-receiving section, contamination by dust into and/or adherence of dust to the light-receiving section. As a result, it is possible to prevent occurrence of defects in the light-receiving section.

The adhesive section 8 is formed, for example, as follows: (i) a sheet adhesive is attached onto the solid-state image pickup element 2, and then (ii) processes such as exposure and development are carried out with respect to the sheet adhesive by use of photolithography so that the adhesive is patterned. The use of photolithography as above allows patterning of the adhesive section 8 to be carried out with high precision. Further, the use of a sheet adhesive allows the adhesive section 8 to have a uniform thickness. This allows the light-transmitting member 5 to be bonded to the light-receiving section with high precision.

According to the camera module 500, the space surrounded by the light-receiving section of the solid-state image pickup element 2 and the light-transmitting member 5 is a hollow. Thus, external light which has passed through the light-transmitting member 5 is directly incident on the light-receiving section. As such, optical loss does not occur in the light path.

The camera module 500 arranged as above achieves the same effect as the camera module 300. In addition, the light-receiving section of the solid-state image pickup element 2 in the camera module 500 is covered by the light-transmitting member 5. This causes the light-receiving section of the solid-state image pickup element 2 not to be exposed. As such, it is surely possible to prevent contamination by dirt into the light-receiving section of the solid-state image pickup element 2.

In the camera modules 300, 400, and 500, illustrated in FIGS. 4, 5, and 6, respectively, an adhesive (not shown) can be applied to the internal surfaces (i.e., in the space S) of the surrounding section 42 and the unthreaded section 43, as in the camera module 200 of the second embodiment. Further, an adhesive (not shown) can be also applied to the tension ring 7. These arrangements can also cause dirt caught in the space S to adhere to the adhesive, thereby ensuring that it is in the space S that the dirt is caught. This consequently prevents occurrence of imaging defects caused by the dirt for an extended period of time, and surely prevents a contamination by dirt into the light path P.

As described above, according to each of the camera modules 300, 400, and 500 of the present embodiment, a mechanism is provided outside the lens holder 4 (the holding section 41), in a camera module which includes the solid-state image pickup element 2 and the macro mechanism (the lens barrel 32 and the macro ring 33). Further, since the holding section 41 and the unthreaded section 43 each serve as a wall, the tension ring 7 is kept away from the solid-state image pickup element 2. This can prevent imaging defects caused when (i) a foreign object externally contaminates the lens holder 4 via the macro mechanism, and when (ii) a foreign object such as a scraped fragment caused by, for example, abrasion in movable sections of the macro mechanism (i.e., a friction between the lens barrel 32 and the macro ring 33) enters the light path P. In other words, each of the camera modules 300, 400, and 500 of the present embodiment is capable of preventing contamination by an external foreign object, and also preventing a leakage, into a space above the solid-state image pickup element 2, of a foreign object caused by the frictions between the movable sections (i.e., a friction between the lens barrel 32 and the macro ring 33; a friction between the macro ring 33 and the holding section 41; a friction between the tension ring 7 and the surrounding section 42, for example). Further, since the tension ring 7 is contained in the space S (groove) of the lens holder 4, it is possible to readily assemble each of the camera modules 300, 400, and 500.

For example, ten thousand normal macro photography operations are ordinarily guaranteed. In contrast, each of the camera modules 300, 400, and 500 of the present embodiment is capable of preventing contamination by a foreign object or the like into the light path P, even in a case where a scraped fragment, for example, is caused. This allows prevention of imaging defects. As such, an increase in the number of macro photography operations does not affect an image photographed by each of the camera modules 300, 400, and 500. As a result, it is possible to improve durability in view of repeated macro photography operations (i.e., to increase the number of warranted macro photography operations).

Figure 7:
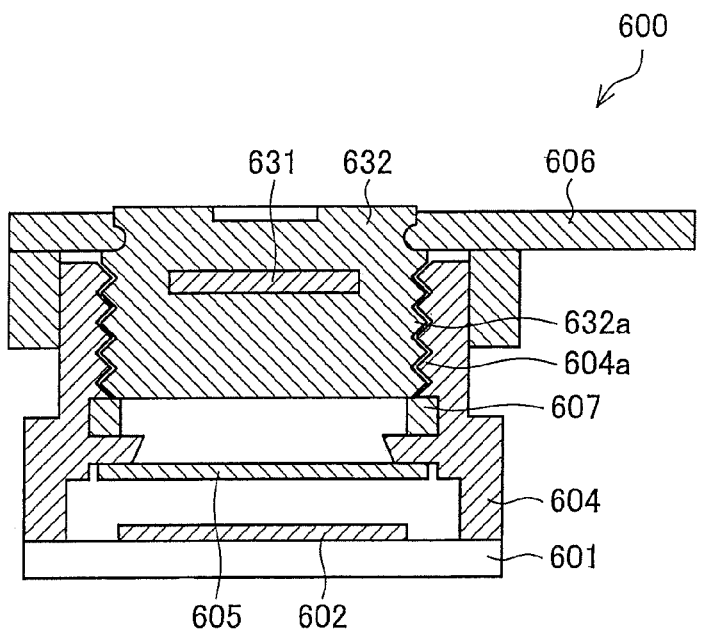
FIG. 7 is a cross-sectional view illustrating a camera module of Patent Document 1.

In a case of a conventional camera module 600 illustrated in FIG. 7, a tension ring 607 has an external diameter smaller than an internal diameter of a lens holder 604. This may cause the tension ring 607 to be inserted in the lens holder 604 at a slant or to be out of intended position, during assembling of the camera module 600. If the camera module 600 is assembled under the circumstances, then a scraped fragment will be caused and/or operating force of a macro lever 606 will become excessively large. This necessitates an additional operation such as reinserting the tension ring 607 in the intended position.

In contrast, according to each of the camera modules 300, 400, and 500 of the present embodiment, the lens holder 4 (the holding section 41, the surrounding section 42) serves as a guiding member causing the tension ring 7 to be disposed in an intended position. In addition, even if the tension ring 7 is inserted at a slant, screwing of the lens unit 3 (the macro ring 33) into the lens holder 4 causes the tension ring 7 to be level. This eliminates the need to, for example, reinsert the tension ring 7 in the intended position, unlike the conventional camera module 600.

The present invention is not limited to the embodiments above, but can be altered by a skilled person within the scope of the claims. An embodiment derived from a proper combination of technical means disclosed in different embodiments falls within the technical scope of the present invention.

As described above, the solid-state image pickup device of the present invention is arranged such that the lens unit is provided with the first internal screw section on its internal side part, and that the holding section of the lens holder, the holding section holding the lens unit, is provided with the first external screw section on its outer periphery part, the first external screw section being engaged with the first internal screw section. This prevents contamination by dirt into the light path, the dirt being caused by a friction between the lens unit and the lens holder (the first internal screw section of the lens unit and the first external screw section of the holding section). As a result, it is possible to reduce imaging defects caused by such dirt.

The solid-state image pickup device of the present invention may preferably be arranged such that the lens barrel has a second external screw section on its external side, the macro ring has a second internal screw section on its internal side, the second internal screw section being engaged with the second external screw section, and the first internal screw section is formed closer to the light than the second internal screw section is.

According to the above invention, the second internal screw section is formed on the internal side surface of the macro ring, in addition to the first internal screw section. The second internal screw section is engaged with the second external screw section formed on the external side part of the lens barrel. In addition, the first and second internal screw sections formed on the internal side surface of the macro ring are provided on an inner side (closer to the light path) and on an outer side, respectively. In other words, the holding section is formed to so as to be closer to the light path than the second internal screw section. This causes the holding section to serve as a barrier for keeping the area, where the lens barrel and the macro ring are in contact with each other, away from the solid-state image pickup element. As such, even in a case where dirt is caused by the friction between the lens barrel and the macro ring, it is possible to prevent contamination by such dirt into the light path. As a result, it is possible to reduce imaging defects caused by such dirt.

The solid-state image pickup device of the present invention may preferably be arranged such that the lens holder includes a surrounding section surrounding a bottom part and an outer periphery part of the lens unit.

According to the above invention, the lens holder includes, in addition to the holding section holding the lens unit, a surrounding section surrounding the bottom part and the outer periphery part of the lens unit. This allows a space to be defined by the holding section and the surrounding section, the space containing the lens unit (the lens barrel). As such, even in a case where dirt is caused by a friction between the lens unit (the lens barrel) and the holding section, the dirt is caught in the space. This prevents the dirt from leaking out of the space to float in the air within the solid-state image pickup device even if vibration or impact is applied to the solid-state image pickup device. As a result, it is possible to surely reduce imaging defects caused by such dirt.

Furthermore, the surrounding section, which is formed along the bottom part and the external side surface of the lens unit (the lens barrel), also serves as a member stably supporting the lens unit (the lens barrel). In addition, the surrounding section further serves as a member protecting the lens unit (the lens barrel) since the lens unit (the lens barrel) is not exposed.

The solid-state image pickup device of the present invention may preferably further include a buffer member on a surface of the surrounding section, the surface facing the bottom part of the lens unit, the buffer member cushioning impact caused by contact between the lens holder and the lens unit.

According to the above invention, the buffer member for cushioning impact caused by contact between the lens holder and the lens unit is provided on a surface of the lens holder, the surface facing the bottom part of the lens unit. This allows the buffer member to be provided outside the light path (outside the lens holder). This in turn keeps, away from the solid-state image pickup element, (i) the area where the buffer member and the lens unit are in contact with each other and (ii) the area where the buffer member and the lens holder are in contact with each other. This prevents contamination by dirt into the light path, the dirt being caused by a friction between the buffer member and the lens holder. As a result, it is possible to reduce imaging defects caused by such dirt.

The solid-state image pickup device of the present invention may preferably be arranged such that the lens holder includes an unthreaded section which extends upward from the first external screw section and has no screw cutting.

According to the above invention, the lens holder (the holding section) includes a portion (the unthreaded section) which is provided so as to have no screw cutting (no screw thread) and to extend upward from the first external screw section. The phrase "upward from the first external screw section" indicates a direction away from the solid-state image pickup element. In other words, the unthreaded section extends in a direction opposite to a direction in which the solid-state image pickup element is provided. This allows the unthreaded section to surely prevent contamination by dirt into the light path, the dirt being caused by a friction between the lens unit and the lens holder. In other words, the unthreaded section serves as a wall (dam) for preventing the contamination by the dirt into the light path. As a result, it is possible to more surely reduce imaging defects caused by such dirt.

An electronic apparatus of the present invention includes any one of the above solid-state image pickup devices. This allows provision of an electronic apparatus capable of preventing contamination by dirt into the light path so as to reduce imaging defects.

The present invention is applicable to various image pickup devices each of which includes a solid-state image pickup device, the various image pickup devices being exemplified by a camera-equipped portable phone, a digital still camera, and a security camera such as a surveillance camera and a door phone.

The present invention is not limited to the embodiments above, but can be altered by a skilled person within the scope of the claims. An embodiment derived from a proper combination of technical means disclosed in different embodiments falls within in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A solid-state image pickup device comprising:
a lens unit for forming an object image;
a solid-state image pickup element for converting the object image, formed by the lens unit, into an electric signal;
a lens holder containing the solid-state image pickup element and holding the lens unit; and
a buffer member on a surface of the surrounding section, the surface facing the bottom part of the lens unit, the buffer member cushioning impact caused by contact between the lens holder and the lens unit,
the lens unit having a first internal screw section on its internal side,
the lens holder having a holding section holding the lens unit,
the holding section having a first external screw section on its external side, the first external screw section being engaged with the first internal screw section,
wherein the lens holder includes a surrounding section surrounding a bottom part and an outer periphery part of the lens unit.

2. The solid-state image pickup device according to claim 1, wherein
the lens unit includes:
a lens;
a lens barrel holding the lens; and
a macro ring holding the lens barrel,
the first internal screw section being formed on an internal side of the macro ring.

3. The solid-state image pickup device according to claim 2, wherein
the lens barrel has a second external screw section on its external side,
the macro ring has a second internal screw section on its internal side, the second internal screw section being engaged with the second external screw section, and
the first internal screw section is formed closer to a light path than the second internal screw section is.

4. The solid-state image pickup device according to claim 2, wherein the lens holder includes a surrounding section surrounding a bottom part and an outer periphery part of the lens unit.

5. The solid-state image pickup device according to claim 4, further comprising a buffer member on a surface of the surrounding section, the surface facing the bottom part of the lens unit, the buffer member cushioning impact caused by contact between the lens holder and the lens unit.

6. The solid-state image pickup device according to claim 1, wherein the lens holder includes an unthreaded section which extends upward from the first external screw section and has no screw cutting.

7. The solid-state image pickup device according to claim 2, wherein the lens holder includes an unthreaded section which extends upward from the first external screw section and has no screw cutting.

8. The solid-state image pickup device according to claim 1, wherein the lens holder includes an unthreaded section which extends upward from the first external screw section and has no screw cutting.

9. The solid-state image pickup device according to claim 4, wherein the lens holder includes an unthreaded section which extends upward from the first external screw section and has no screw cutting.

10. The solid-state image pickup device according to claim 1, wherein an adhesive is applied to an internal surface of the surrounding section.

11. The solid-state image pickup device according to claim 4, wherein an adhesive is applied to an internal surface of the surrounding section.

12. The solid-state image pickup device according to claim 1, wherein an adhesive is applied to the buffer member.

13. The solid-state image pickup device according to claim 5, wherein an adhesive is applied to the buffer member.

14. The solid-state image pickup device according to claim 7, wherein an adhesive is applied to the unthreaded section.

15. The solid-state image pickup device according to claim 1, further comprising a light-transmitting member provided above the solid-state image pickup element so as to cover a light-receiving section of the solid-state image pickup element and so that a spacing is provided between the light-transmitting member and the light-receiving section.

16. The solid-state image pickup device according to claim 2, further comprising a light-transmitting member provided above the solid-state image pickup element so as to cover a light-receiving section of the solid-state image pickup element and so that a spacing is provided between the light-transmitting member and the light-receiving section.

17. A solid-state image pickup device comprising:
   a lens unit for forming an object image;
   a solid-state image pickup element for converting the object image, formed by the lens unit, into an electric signal; and
   a lens holder containing the solid-state image pickup element and holding the lens unit,
   the lens unit having a first internal screw section on its internal side,
   the lens holder having a holding section holding the lens unit,
   the holding section having a first external screw section on its external side, the first external screw section being engaged with the first internal screw section,
   wherein the lens holder includes an unthreaded section which extends upward from the first external screw section and has no screw cutting,
   wherein an adhesive is applied to the unthreaded section.

18. An electronic apparatus comprising a solid-state image pickup device,
   the solid-state image pickup device including:
   a lens unit for forming an object image;
   a solid-state image pickup element for converting the object image, formed by the lens unit, into an electric signal;
   a lens holder containing the solid-state image pickup element and holding the lens unit; and
   a buffer member on a surface of the surrounding section, the surface facing the bottom part of the lens unit, the buffer member cushioning impact caused by contact between the lens holder and the lens unit,
   the lens unit having a first internal screw section on its internal side,
   the lens holder having a holding section holding the lens unit,
   the holding section having a first external screw section on its external side, the first external screw section being engaged with the first internal screw section,
   wherein the lens holder includes a surrounding section surrounding a bottom part and an outer periphery part of the lens unit.

19. An electronic apparatus comprising a solid-state image pickup device,
   the solid-state image pickup device including:
   a lens unit for forming an object image;
   a solid-state image pickup element for converting the object image, formed by the lens unit, into an electric signal; and
   a lens holder containing the solid-state image pickup element and holding the lens unit,
   the lens unit having a first internal screw section on its internal side,
   the lens holder having a holding section holding the lens unit,
   the holding section having a first external screw section on its external side, the first external screw section being engaged with the first internal screw section,
   wherein the lens holder includes an unthreaded section which extends upward from the first external screw section and has no screw cutting,
   wherein an adhesive is applied to the unthreaded section.

* * * * *